United States Patent

Eschard

[15] 3,673,449

[45] June 27, 1972

[54] CHANNEL AMPLIFYING DEVICE COMPRISING A PLURALITY OF COUPLED CHANNEL PLATES

[72] Inventor: Gilbert Eschard, Paris, France

[73] Assignee: U.S. Philips Corporation, New York, N.Y.

[22] Filed: April 1, 1970

[21] Appl. No.: 24,675

[30] Foreign Application Priority Data

April 4, 1969 France ..................................6910558

[52] U.S. Cl. .............................................................313/105
[51] Int. Cl. .........................................................H01j 43/00
[58] Field of Search ..................313/105, 105 X, 104, 67, 95; 315/10, 11, 12

[56] References Cited

UNITED STATES PATENTS

| | | | |
|---|---|---|---|
| 3,487,258 | 12/1969 | Manley et al. | 315/11 |
| 3,506,868 | 4/1970 | Ceckowski et al. | 313/105 |

*Primary Examiner*—Ronald L. Wibert
*Assistant Examiner*—Conrad Clark
*Attorney*—Frank R. Trifari

[57] ABSTRACT

A channel amplifying device comprising a plurality of coupled channel plates, the diameters of the channels on either side of the coupling area being different from each other, one channel of one of the channel plates opening out in a plurality of channels of the channel plate coupled therewith.

3 Claims, 3 Drawing Figures

PATENTED JUN 27 1972 3,673,449

Figure 1:
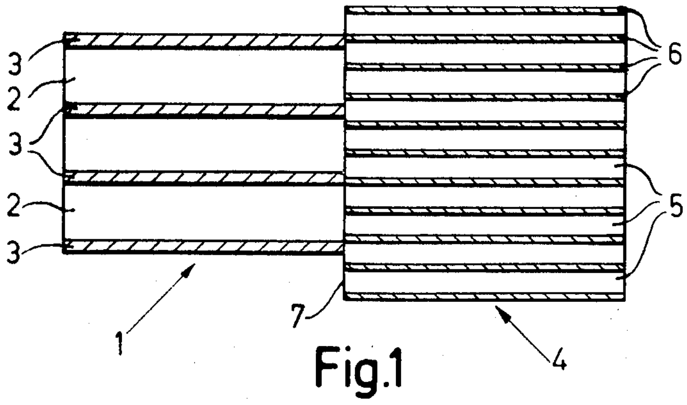

INVENTOR.
GILBERT ESCHARD
BY
AGENT

CHANNEL AMPLIFYING DEVICE COMPRISING A PLURALITY OF COUPLED CHANNEL PLATES

This invention relates to a channel amplifying device comprising at least two coupled channel plates.

Such a channel amplifying device is known from French Patent specification 1,499,715. In this Patent specification a channel amplifier is disclosed, which comprises two channel plates coupled so that the axes of the channels of the two plates are at an angle differing from 180°. Thus the relative variations of speed of the emerging electrons are reduced.

Such two-plate channel amplifiers require the two channel plates to be coupled with each other so that all channels form uninterrupted passages. If this requirement is not satisfied, signal strength variations are producing the output signal between portions where the channels accurately communicate with each other and portions where the channels of one of the plates also open out on channel walls of the other plate.

The invention has for its object to avoid this disadvantage and in accordance with the invention a channel amplifying device of the kind set forth is characterized in that the ends of the channels on either side of the coupling area have different diameters and in that one channel of one of the plates is coupled with a plurality of channels of the plate connected with the former.

Because in a channel amplifier in accordance with the invention each channel of a plate opens out in a plurality of channels of the plate coupled therewith, uniform matching is obtained throughout the section so that viewed in the cross section of the channel plate differences in signal strength of the output signal will no longer occur. Matching of the channels need no longer be taken into consideration when coupling the two channel plates. Therefore, coupling can be carried out more easily and rapidly.

Figure 2:
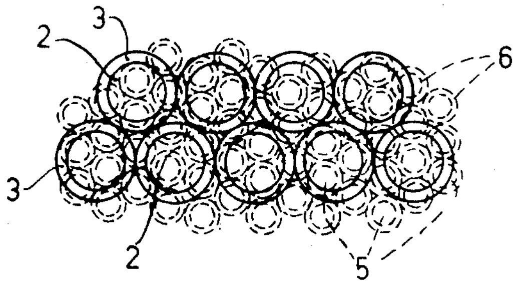

A few embodiments of channel amplifiers in accordance with the invention will be described more fully with reference to the drawing, which shows:

in FIG. 1 two coupled channel plates in a longitudinal view,

FIG. 2 these channel plates viewed transversely of the coupling plane and

Figure 3:
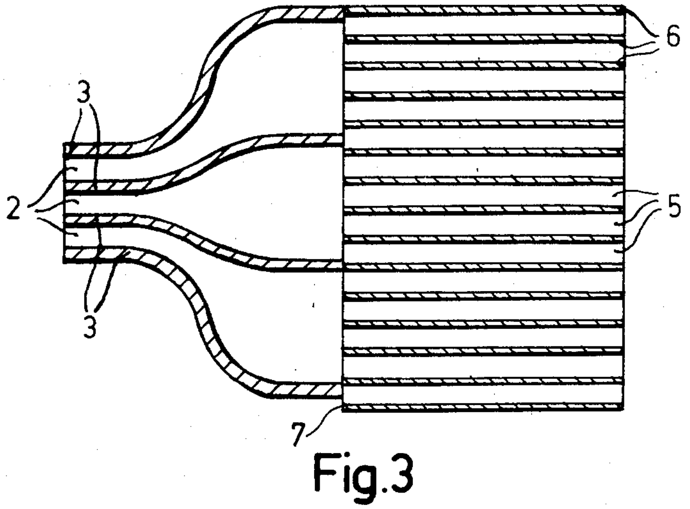

FIG. 3 a further embodiment of two coupled channel plates in accordance with the invention.

FIG. 1 shows a channel plate 1 having channels 2 with wall portions 3 and a channel plate 4 with channels 5 and wall portions 6, which two plates 1 and 4 are coupled with each other in an interface 7. The number of channel plates may be extended at will both for improving the homogeneity of the output signal and for other reasons, for example, for bending through an angle, magnifying or reducing the cross section for various magnifications. The Figures and the following description is based by way of example on only two channel plates. The method of coupling the two channel plates in the interface 7 is irrelevant for this invention. Any known method of coupling, for example cementing or molecular contacting may be employed. Because the transverse position, also viewed in a rotation about a longitudinal axis, is much less critical in this case, it is even possible to use coupling methods which could not be used in known channel amplifiers due to the inaccuracy of the fixation.

The interposition of an electron-optical element between two channel plates, for example, electrodes for applying a local potential, can be carried out more readily in channel amplifiers according to the invention, since the channels need not register with each other.

With a channel amplifier according to the invention it is not essential whether the axes of the channels on either side of the interface 7 are parallel to each other or are at an angle differing from 180° to each other. It is furthermore possible to use in one or in both channel plates widening or narrowing channels as is shown in FIG. 3 for the channel plate 1. This preferred embodiment is particularly suitable for use in devices in which the channel amplifier transmits an image which has to be magnified or reduced. In a preferred embodiment the ratio between the diameters of the channels of the two plates lies between about 1.5 and 5. In channel amplifiers in which the image has to be magnified said ratio may be higher.

If one transition of channel diameters is insufficient for obtaining adequate homogeneity in the output signal, a plurality of transitions may be formed. From the input side of the channel amplifier towards the output side thereof the diameters preferably decrease in said ratio at each transition. Apart from the uses mentioned above, a channel amplifier according to the invention may appropriately be used in a photo-electric amplifying tube.

What is claimed is:

1. A channel amplifying device comprising an output channel plate having output channels, and an input channel plate having input channels, said input channel plate being coupled to said output channel plate, said input channels each having a diameter which is larger than the diameter of said output channels, the ratio of said diameters of said input channels to said output channels being between about 1.5 and 5.0.

2. A channel amplifying device as described in claim 1, wherein said channel amplifying device is an electron amplifying tube.

3. A channel amplifier as claimed in claim 1 wherein the diameters of the input channels vary along their longitudinal axes.

* * * * *